United States Patent [19]

East et al.

[11] Patent Number: 5,061,760

[45] Date of Patent: Oct. 29, 1991

[54] VINYLIDENE CYANIDE ALTERNATING COPOLYMERS EXHIBITING NONLINEAR OPTICAL AND PIEZOELECTRIC PROPERTIES

[75] Inventors: Anthony J. East, Madison; Anthony B. Conciatori, Chatham, both of N.J.

[73] Assignee: Hoechst Celanese Corp., Somerville, N.J.

[21] Appl. No.: 570,064

[22] Filed: Aug. 20, 1990

Related U.S. Application Data

[63] Continuation-in-part of Ser. No. 491,138, Mar. 9, 1990.

[51] Int. Cl.[5] .................. C08F 16/00; B29C 35/02; B06B 1/02; G11C 13/02
[52] U.S. Cl. ................ 525/328.2; 525/377; 264/22; 264/24; 307/400
[58] Field of Search ............... 526/297, 300; 264/22, 264/24; 307/400; 525/328.2, 377

[56] References Cited

U.S. PATENT DOCUMENTS

| | | | |
|---|---|---|---|
| 2,615,868 | 10/1952 | Miller | 526/172 |
| 2,716,105 | 8/1955 | Gilbert et al. | 526/297 |
| 2,716,106 | 8/1955 | Gilbert et al. | 526/297 |
| 2,975,158 | 3/1961 | Sayre | 526/297 |
| 4,302,408 | 11/1981 | Ichihara et al. | 264/22 |
| 4,345,359 | 8/1982 | Micheron | 264/22 |
| 4,346,505 | 8/1982 | Lemonon et al. | 264/22 |
| 4,591,465 | 5/1986 | Miyata et al. | 264/24 |
| 4,668,449 | 5/1987 | Soni et al. | 264/22 |
| 4,684,337 | 8/1987 | Bauer | 264/22 |
| 4,767,169 | 8/1988 | Teng et al. | 350/96.14 |
| 4,830,795 | 5/1989 | Scheinbeim et al. | 264/24 |
| 4,863,648 | 9/1989 | Scheinbeim et al. | 264/24 |
| 4,990,584 | 2/1991 | Kishimoto et al. | 526/300 |

FOREIGN PATENT DOCUMENTS

| | | | |
|---|---|---|---|
| 0264240 | 4/1988 | European Pat. Off. | 526/300 |
| 1137553 | 6/1961 | Fed. Rep. of Germany | 526/300 |
| 6094414 | 5/1985 | Japan | 526/297 |
| 1-103614 | 4/1989 | Japan | 526/300 |
| 0887574 | 12/1981 | U.S.S.R. | 526/297 |
| 756839 | 9/1956 | United Kingdom | 526/300 |

*Primary Examiner*—Joseph L. Schofer
*Assistant Examiner*—N. Sarofim
*Attorney, Agent, or Firm*—DePaoli & O'Brien

[57] ABSTRACT

In one embodiment this invention provides vinylidene cyanide copolymers with alternating monomeric units as illustrated by the following structure:

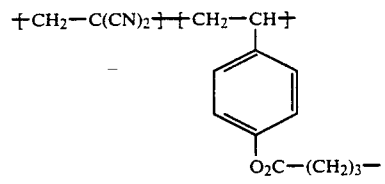

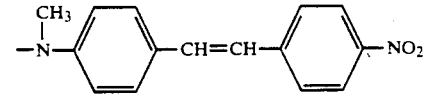

An invention vinylidene cyanide copolymer in the form of an electret film exhibits a high level of longitudinal piezoelectric effect, and has excellent processability properties. An electret film which has an external electric field-induced noncentrosymmetric dipolar molecular orientation exhibits second order nonlinear optical susceptibility under light propagation conditions.

11 Claims, No Drawings

VINYLIDENE CYANIDE ALTERNATING COPOLYMERS EXHIBITING NONLINEAR OPTICAL AND PIEZOELECTRIC PROPERTIES

This invention was made with Government support under Contract Number F49620-87-C-0109. The Federal Government has certain rights in this invention.

CROSS-REFERENCE TO RELATED APPLICATION

This patent application is a continuation-in-part of copending patent application Ser. No. 491,138, filed Mar. 9, 1990.

BACKGROUND OF THE INVENTION

It is known that organic and polymeric materials with large delocalized $\pi$-electron systems can exhibit nonlinear optical response, which in many cases is a much larger response than by inorganic substrates.

Thin films of organic or polymeric materials with large second order nonlinearities in combination with silicon-based electronic circuitry have potential as systems for laser modulation and deflection, information control in optical circuitry, and the like.

Other novel processes occurring through third order nonlinearity such as degenerate four-wave mixing, whereby real-time processing of optical fields occurs, have potential utility in such diverse fields as optical communications and integrated circuit fabrication.

There is continuing research effort to develop new nonlinear optical organic systems for prospective novel phenomena and devices adapted for laser frequency conversion, information control in optical circuitry, light valves and optical switches. The potential utility of organic materials with large second order and third order nonlinearities for very high frequency application contrasts with the bandwidth limitations of conventional inorganic electrooptic materials.

Optical devices which have a polymeric nonlinear optical component are described in U.S. Pat. No. 4,767,169 and U.S. Pat. No. 4,865,406.

Other types of organic materials have been developed which have a novel combination of useful properties, such as electrets which are produced by applying a DC voltage to stretched films of polymers such as polyvinyl fluoride, polyvinylidene fluoride, polyvinyl chloride, polyvinylidene fluoride, polyvinyl chloride, polyacrylonitrile, polycarbonate or nylon 11, while maintaining the films at high temperature and then cooling. These films exhibit piezoelectric and pyroelectric properties.

Polymeric electret elements are useful in electro-acoustic conversion devices, electro-mechanical conversion devices, pressure-sensitive elements, bimorph elements, microwave-detection devices, image-recording light-sensitive elements, and the like.

Publications of background interest with respect to present invention electret compositions include U.S. Pat. Nos. 2,615,868 and 4,591,465, which describe copolymers of vinylidene cyanide.

There is continuing interest in the development of novel polymeric materials which exhibit improved piezoelectric and pyroelectric properties, and superior moldability and thermal stability.

Accordingly, it is an object of this invention to provide novel polymers which exhibit nonlinear optical and piezoelectric properties.

It is another object of this invention to provide novel thermoplastic polymers and optical media thereof which are characterized by recurring pendant side chains which exhibit nonlinear optical response.

It is a further object of this invention to provide polymeric electret films which exhibit a high longitudinal piezoelectric effect, and which can function as a transducing element in electro-acoustic, electro-mechanic or pressuresensitive conversion devices.

Other objects and advantages of the present invention shall become apparent from the accompanying description and examples.

DESCRIPTION OF THE INVENTION

One or more objects of the present invention are accomplished by the provision of a copolymer which is characterized by alternating monomeric units corresponding to the formula:

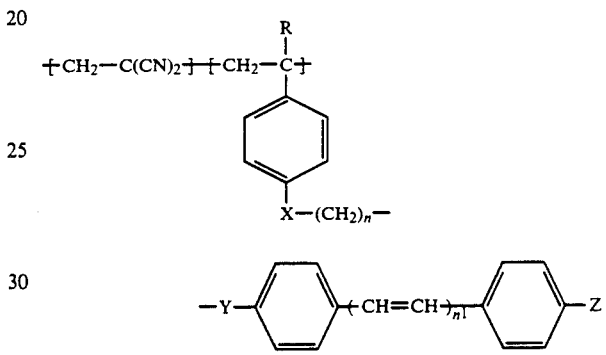

where R is hydrogen or a $C_1$–$C_4$ alkyl substituent; X is -$O_2$C-, -$O_2$C-O- or -$O_3$S-; Y is -S-, -O- or -NR-; Z is -$NO_2$, -CN or -$CF_3$; n is an integer with a value of 2–12; and $n^1$ is an integer with a value of 0–2.

The R substituent in the formula typically will be hydrogen or methyl.

A present invention vinylidene cyanide copolymer normally has a weight average molecular weight in the range between about 5000–300,000. The copolymers generally are soluble in organic solvents such as dimethylformide or 1,2-dichloroethane, and insoluble in benzene or toluene.

In one method of copolymer synthesis an alternating, copolymer of vinylidene cyanide and 4-acyloxystyrene is prepared as a first step. The copolymer product is subjected to hydrolytic conditions to provide the corresponding copolymer of vinylidene cyanide and 4-hydroxystyrene. Novel side chain copolymers can be obtained by esterifying the vinylidene cyanide/4-hydroxystyrene intermediate with a reactant corresponding to the formula:

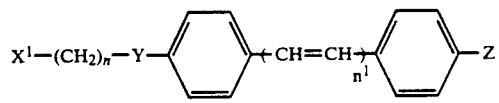

where $X^1$ is Cl-CO-, Cl-$CO_2$- or Cl-$SO_2$-, and Y, Z, n and $n^1$ are as previously defined.

In accordance with the esterification steps described above, the vinylidene cyanide/side chain monomer copolymer can contain residual 3-hydroxystyrene monomer units in an amount varying from essentially zero molar percent to up to about 60 molar percent or higher based on the molar quantity of free 3-hydroxystyrene monomer units in the intermediate copolymer.

In another embodiment this invention provides a second order nonlinear optically responsive medium which comprises a thin film of a copolymer which is characterized by alternating monomeric units corresponding to the formula:

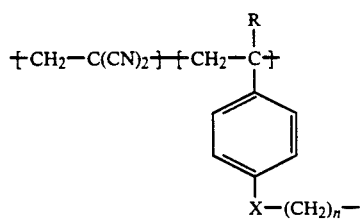

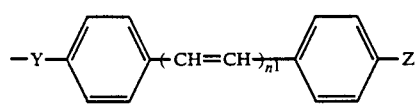

where R is hydrogen or a $C_1$-$C_4$ alkyl substituent; X is -$O_2C$-, -$O_2C$-$O$- or -$O_3S$-; Y is -S-, -O- or -NR-; Z is -$NO_2$, -CN or -$CF_3$; n is an integer with a value of 2–12; and $n^1$ is an integer with a value of 0–2; wherein the thin film has an external electric field-induced net polar orientation of polymer molecules.

In another embodiment this invention provides an electret film of a thermoplastic copolymer which is characterized by alternating monomeric units corresponding to the formula:

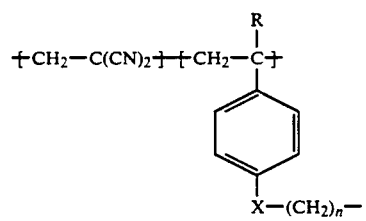

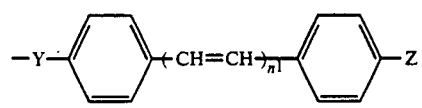

where R is hydrogen or a $C_1$-$C_4$ alkyl substituent; X is -$O_2C$-, -$O_2C$-$O$- or -$O_3S$-; Y is -S-, -O- or -NR-; Z is -$NO_2$, -CN or -$CF_3$; n is an integer with a value of 2–12; and $n^1$ is an integer with a value of 0–2; wherein the film is characterized by a crystallographic orientation of copolymer molecules in the film plane which has been induced by mechanical stretching, and the film exhibits piezoelectric properties.

In another embodiment this invention provides an electret film of a thermoplastic copolymer which is characterized by alternating monomeric units corresponding to the formula:

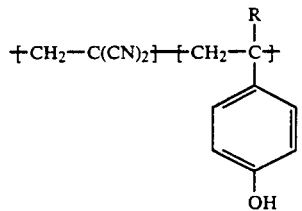

where R is hydrogen or a $C_1$-$C_4$ alkyl substituent; wherein the film is characterized by a crystallographic orientation of copolymer molecules in the film plane which has been induced by mechanical stretching, and the film exhibits piezoelectric properties.

In another embodiment this invention provides an electro-acoustic conversion or electro-mechanic conversion or pressure-sensitive device having an electret film component of a copolymer which is characterized by alternating monomeric units corresponding to the formula:

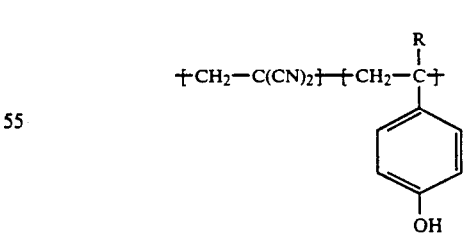

where R is hydrogen or a $C_1$-$C_4$ alkyl substituent; X is -$O_2C$-, -$O_2C$-$O$- or -$O_3S$-; Y is -S-, -O- or -NR-; Z is -$NO_2$, -CN or -$CF_3$; n is an integer with a value of 2–12; and $n^1$ is an integer with a value of 0–2; wherein the film has an external field-induced net dipolar orientation of polymer molecules, and the film exhibits piezoelectric properties.

In a further embodiment this invention provides an electro-acoustic conversion or electro-mechanic conversion or pressure-sensitive device having an electret film component of a copolymer which is characterized by alternating monomeric units corresponding to the formula:

where R is hydrogen or a $C_1$-$C_4$ alkyl substituent; wherein the film has an external field-induced net dipolar orientation of polymer molecules, and the film exhibits piezoelectric properties.

A present invention vinylidene cyanide copolymer has excellent processability properties, and is readily formed into a thin film which is amenable to stretching and electric field modes of molecular orientation, and which exhibits a nonlinear optical response and has a high piezoelectric modulus.

An invention electret film exhibits an enhanced level of piezoelectric and pyroelectric response when the film copolymeric matrix has a crystallographic molecular orientation in the film plane which has been induced by longitudinal uniaxial mechanical stretching, or by longitudinal and transverse biaxial mechanical stretching, and additionally has an electric field induced polarization. Techniques for molecular orientation in polymeric electret films by stretching or by an electric field are described in publications such as U.S. Pat. No. 4,302,408 and U.S. Pat. No. 4,591,465.

A vinylidene cyanide copolymer film of the present invention can be formed by press molding, calender molding or solvent casting. The film can be stretched 2-6 lengths by mechanical monoaxial or biaxial stretching with a calender rolling or stretching apparatus.

Poling of an invention polymeric film can be accomplished by heating the film at a temperature which is near the glass transition temperature, applying a DC electric field (100-1500 kv/cm) to the film by electrodes for a period of about 0.1-2 hours, and then cooling the film while maintaining the external field poling bias.

The following examples are further illustrative of the present invention. The components and specific ingredients are presented as being typical, and various modifications can be derived in view of the foregoing disclosure within the scope of the invention.

EXAMPLE I

Preparation of an alternating copolymer of vinylidene cyanide and 4-acetoxystyrene in accordance with the present invention.

All glassware is acid-washed, dried and treated with trimethylsilyl chloride in toluene.

Vinylidene cyanide is prepared by the pyrolysis of 1-acetoxy-1,1-dicyanoethane at 650° C. in a vertical quartz tube packed with quartz fragments. The crude pyrolysis product is collected in a cold trap at $-60°$ C., and redistilled under reduced pressure into a receiver containing a trace of methanesulfonic acid to inhibit polymerization.

The vinylidene cyanide content of the pyrolyzate is estimated by allowing a sample to homopolymerize in water, and recovering the polymer. It is determined that a 21 g quantity of pyrolyzate is equivalent to 10 g of pure vinylidene cyanide.

A reaction flask fitted with a stirrer, reflux condenser and pressure-equalizing tap-funnel is heated to 70° C. The reactor is charged with a mixture of 21 g of redistilled pyrolyzate (10 g), 10 ml of glacial acetic acid and 1.0 ml of a 4% w/v solution dibenzoyl peroxide catalyst in dry chlorobenzene. 4-Acetoxystyrene (20 g) is added in portions to the reaction flask contents at 70° C. After a polymerization period of about 1.5 hours, vinyl acetate is added to react with any residual vinylidene cyanide.

The excess vinyl acetate is decanted and the resultant white precipitate is recovered and dissolved in acetone. The acetone solution is added to methanol to reprecipitate the polymer (24 g).

The infra-red spectrum shows a weak cyanide band at 2280 cm$^{-1}$, which is characteristic of polymers with a gem-dicyano structure. Nuclear Magnetic Resonance (proton and Carbon-13) indicates that the polymer is a regularly alternating copolymer of vinylidene cyanide and 4-acetoxystyrene. Differential Scanning Colorimetry indicates that the polymer is amorphous, with a strong glass transition temperature inflexion at about 182° C. The inherent viscosity as measured in a 0.5% w/v solution in gamma-butyrolactone is 1.22 at 25° C.

Anal. calc. for alternating copolymer: C,69.53; H,4.95; N,11.89 Found: C,70.00; H,5.00; N,11.67

EXAMPLE II

Preparation of an alternating copolymer of vinylidene cyanide and 4-hydroxystyrene in accordance with the present invention.

A.

A 4.0 g quantity of 4-acetoxystyrene/vinylidene cyanide alternating copolymer is stirred with dry methanol (100 ml) and methanesulfonic acid (1.0 ml) at room temperature for about 16 hours. The solvent medium is decanted, and the rubber-like solid product is washed with water to remove residual acid, and dried to a constant weight in a vacuum oven. The pale-brown polymer product (3.3 g) is clear and brittle, and rapidly absorbs water when exposed to moist air.

A sample of polymer is dissolved in acetone (6% w/v), and the solution is cast as a colorless clear film on a potassium bromide plate. IR spectroscopy indicates that the starting material acetate ester carbonyl band has disappeared, and there is a strong broad hydroxy band at 3300-3400 cm$^{-1}$, and nitrile bands are present as weak absorption at 2240 cm$^{-1}$. DSC indicates that the polymer is amorphous and has a Tg of 220° C.

B.

A 11.5 g quantity of vinylidene cyanide/acetoxystyrene alternating copolymer sample (inherent viscosity of 1.19 in gamma-butyrolactone; Mw, 190,000; Mn 95,000) is methanolyzed under mild conditions by suspending the copolymer in dry methanol (500 ml) adding 3 drops of hydrochloric acid, and refluxing the reaction mixture for about 16 hours under an argon atmosphere.

Triethylamine as added to neutralize the acid. The solvent medium is decanted, and the rubber-like product is washed with methanol and dried to a constant weight at 60° C. under vacuum (0.5 mm) for 10 hours.

The pale-straw colored product is easily soluble in acetone and in tetrahydrofuran. DSC indicates that a cast film of the product has a Tg inflexion at 210° C.

EXAMPLE III

Preparation of alternating copolymers of vinylidene cyanide and (4-substituted)styrene.

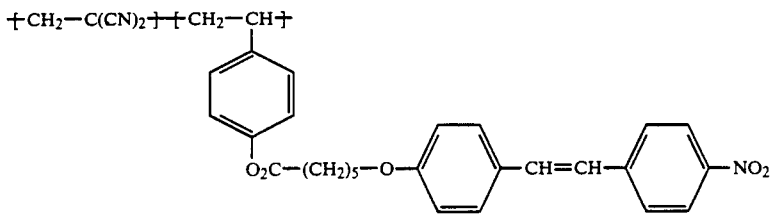

Vinylidene cyanide/4-hydroxystyrene alternating copolymer (3.96 g, 0.2 molar repeat units) is dissolved in pyridine (100 ml) by refluxing under an argon atmosphere.

The reaction medium is cooled to about 50° C., and a solution of 6-(4'-nitrostilben-4-yloxy)hexanoyl chloride (8.2 g; 0.022 mole) in 1,2-dichloroethane (100 ml) is added. The resultant clear yellow solution is stirred at room temperature for 24 hours, then added to 20% aqueous hydrochloric acid (600 ml). A yellow insoluble gum is recovered by filtration, and then dissolved in dimethylformamide. The polymer product is precipitated from solution with methanol, and then redissolved in dimethylformide and reprecipitated with methanol (6.5 g yield).

DSC indicates that the yellow polymer has a Tg of 135° C. NMR indicates that a major portion of the phenolic hydroxyl groups have been esterified, and the remaining hydroxyls are in the free form.

Following the procedure described above, additional alternating copolymers of vinylidene cyanide and (4-substituted)styrene are prepared by replacing the 6-(4'-nitrostilben-4-yloxy)hexanoyl chloride reactant with each of the following compounds:

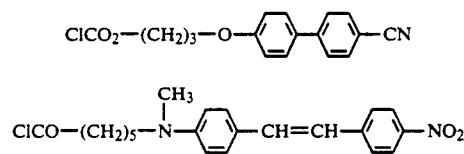

·HCl

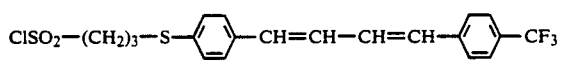

EXAMPLE IV

This Example illustrates the dielectric properties of a vinylidene cyanide/(4-substituted)styrene alternating copolymer in accordance with the present invention.

A 10% w/v solution of vinylidene cyanide/4-[6-(4'-nitrostilben-4-yloxy)hexanoyl]styrene alternating copolymer in dimethylformamide is filtered through a Gelman glass filter. The solution is spin-coated onto conductive indium-tin oxide glass slides, and a gold electrode is vacuum deposited on the surface of each copolymer-coated glass slide.

Each glass slide is heated to 170° C., and poled by applying a DC electric field. The maximum electric field is equivalent to about 75 volts/micron.

Each poled film is measured for its pyroelectric coefficient "p", and its linear opto-electronic coefficient "r". The pyroelectric coefficient "p" is measured by a method substantially as described in J. Phys. E., 5,, 787 (1972) by Hartley et al; and the opto-electronic coefficient "r" is measured by a laser reflectance technique as described in Proc. S.P.I.E., 1147, 222(1989) by Haas et al. The measured values are compared with those for a known vinylidene cyanide/vinyl acetate type of copolymer. The comparative data are summarized in Table I.

TABLE I

| Copolymer | Poling Voltage V/micron | "p" | "r" pm/V |
| --- | --- | --- | --- |
| A[1] | 75 | 9.20 | 0.97 |
| B[2] | 60 | 2.35 | 4.44 |
| B | 75 | 3.57 | 7.10 |

[1] Vinylidene cyanide/vinyl acetate
[2] Vinylidene cyanide/4[6-(4'-nitrostilben-4-yloxy)hexanoyl]styrene

EXAMPLE V

Preparation of an alternating copolymer of vinylidene cyanide and 4-substituted-styrene in accordance with the present invention.

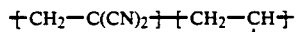

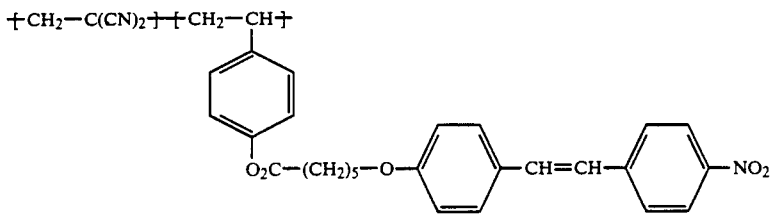

A copolymer of vinylidene dicyanide and 4-hydroxystyrene prepared in accordance with Example II (8.9 g, 0.045 molar repeat units) is dissolved in dry dimethylacetamide (60 ml) with stirring in the cold. The solution is passed first through a Zitex coarse grade PTFE filter membrane, then through a medium grade PTFE membrane and finally through a Whatman GF/F micro glass-fiber pad which retains all particles above 0.7 microns in size. The initially slightly cloudy solution is clear after the filtration treatment.

The filtered solution is placed in a dry flask under an argon atmosphere and stirred magnetically. To the solution is added 5.1 g (0.05 mole) of triethylamine, followed by the dropwise addition of a warm (50° C.) solution of 6-(4'-nitrostilben-4-yloxy)-hexanoyl chloride (18.7 g, 0.05 mole) in dry dichloroethane (150 ml). After 48 hours the mixture is poured into a liter of warm water and stirred for 2 hours (water pH=8.0). The water is decanted from the viscous yellow organic layer and the layer is added with stirring to 1.5 liters of methanol, and a yellow mass separates. After stirring for 30 minutes, the resultant solid is filtered and redissolved in dimethylformamide (500 ml). The dark yellow solution is filtered through a 0.7 micron glass microfiber filter pad, and the clear solution is added slowly (3 drops/second) to 4 liters of methanol with brisk stirring. The polymer product separates as a milky yellow suspension. When all of the polymer has precipitated, it is recovered with a 24 cm Buchner funnel as a fluffy bright yellow solid. Drying to constant weight at 58° C. for 15 hours in vacuum gives a yield of 14.7 g (61% theory). NMR spectroscopy indicated that about 85 mole percent of the hydroxystyrene units have been esterified with the acid chloride. The polymer has a DSC inflexion at about 125° C.

The polymer dissolves readily in dimethylformamide, dimethylacetamide and cyclopentanone to form viscous 12-15% w/v solutions. Tenacious, clear yellow films of excellent quality are spun-coated from 10% solutions in cyclopentanone, and baked out at 120° C. to remove solvent. Gold electrodes are deposited by vacuum deposition in coextensive proximity with film samples. By poling at low fields (50 v/micron) and plotting the Thermally Stimulated Discharge current versus temperature, a pronounced inflexion is found at 111°–113° C., which is the effective glass/rubber transition temperature.

Poling at 111°–113° C. is conducted up to a maximum of 90–95 volts/micron before dielectric breakdown occurred. Film samples poled at 90 v/micron are measured for pyroelectric coefficient (p) and electro-optical coefficient (r) as described in Example IV. The pyroelectric coefficient is 4.56 microcoulombs/square meter/degree K; and the "r" value, measured at 52.2 volts and a wavelength of 632 nanometers, averages 9.93 picometers/volt.

The molecular weight of the vinylidene cyanide/modified styrene copolymer is determined by gel permeation chromatography in N-methylpyrrolidone on a cross-linked polystyrene column, using the Universal Calibration method described in J. Polym. Sci., Part B, (5), p. 753 (1967).

$M_w$=903,000
$M_n$=331,000
mwd=2.7
Intrinsic Viscosity=0.96

What is claimed is:

1. A copolymer which is characterized by alternating monomeric units corresponding to the formula:

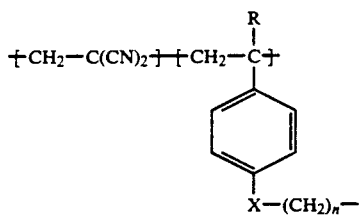

-continued

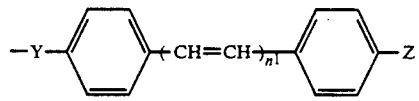

where R is hydrogen or a $C_1$–$C_4$ alkyl substituent; X is -$O_2$C-, -$O_2$C-O- or -$O_3$S-; Y is -S-, -O- or -NR-; Z is -$NO_2$, -CN or -$CF_3$; n is an integer with a value of 2–12; and $n^1$ is an integer with a value of 0–2.

2. A copolymer in accordance with claim 1 wherein R is hydrogen or methyl.

3. A copolymer in accordance with claim 1 which additionally contains monomeric units of copolymerized 4-hydroxystyrene.

4. A copolymer in accordance with claim 1 wherein the copolymer has a weight average molecular weight in the range between about 5000–300,000.

5. A polymer which is characterized by alternating monomeric units corresponding to the formula:

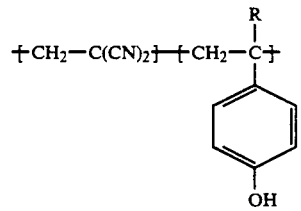

wherein R is hydrogen or a $C_1$–$C_4$ alkyl substituent, and the copolymer has a weight average molecular weight in the range between about 5000–300,000.

6. A second order nonlinear optically responsive medium which comprises a thin film of a copolymer which is characterized by alternating monomeric units corresponding to the formula:

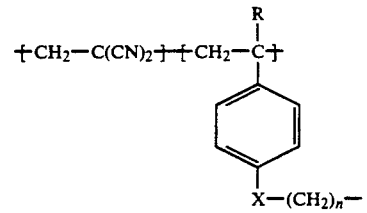

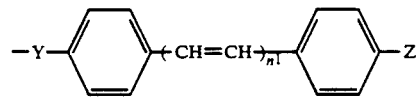

where R is hydrogen or a $C_1$–$C_4$ alkyl substituent; X is -$O_2$C-, -$O_2$C-O- or -$O_3$S-; Y is -S-, -O- or -NR-; Z is -$NO_2$, -CN or -$CF_3$; n is an integer with a value of 2–12; and $n^1$ is an integer with a value of 0–2; wherein the thin film has an external electric field-induced net polar orientation of polymer molecules.

7. An optical medium in accordance with claim 6 wherein in the copolymer formula Y is -NR-; $n^1$ has a value of one; and Z is -$NO_2$.

8. An electret film of a thermoplastic copolymer which is characterized by alternating monomeric units corresponding to the formula:

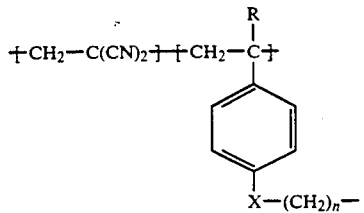

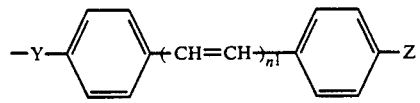

where R is hydrogen or a $C_1$–$C_4$ alkyl substituent; X is -$O_2C$-, -$O_2C$-$O$- or -$O_3S$-; Y is -S-, -O- or -NR-; Z is -$NO_2$, -CN or -$CF_3$; n is an integer with a value of 2–12; and $n^1$ is an integer with a value of 0–2; wherein the film is characterized by a crystallographic orientation of copolymer molecules in the film plane which has been induced by mechanical stretching, and the film exhibits piezoelectric properties.

9. An electret film of a thermoplastic copolymer which is characterized by alternating monomeric units corresponding to the formula:

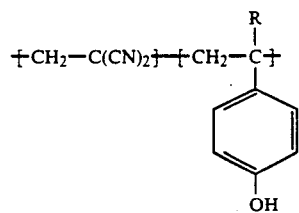

where R is hydrogen or a $C_1$–$C_4$ alkyl substituent; wherein the film is characterized by a crystallographic orientation of copolymer molecules in the film plane which has been induced by mechanical stretching, and the film exhibits piezoelectric properties.

10. An electro-acoustic conversion or electromechanic conversion or pressure-sensitive device having an electret film component of a copolymer which is characterized by alternating monomeric units corresponding to the formula:

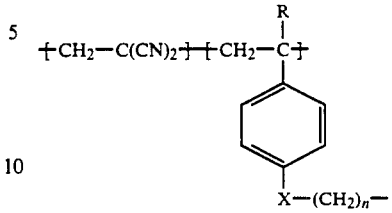

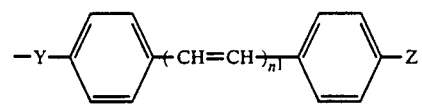

where R is hydrogen or a $C_1$–$C_4$ alkyl substituent; X is -$O_2C$-, -$O_2C$-$O$- or -$O_3S$-; Y is -S-, -O- or -NR-; Z is -$NO_2$, -CN or -$CF_3$; n is an integer with a value of 2–12; and $n^1$ is an integer with a value of 0–2; wherein the film has an external field-induced net dipolar orientation of polymer molecules, and the film exhibits piezoelectric properties.

11. An electro-acoustic conversion or electromechanic conversion or pressure-sensitive device having an electret film component of a copolymer which is characterized by alternating monomeric units corresponding to the formula:

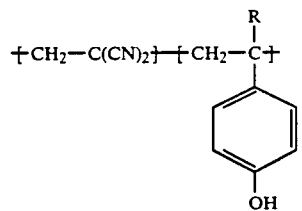

where R is hydrogen or a $C_1$–$C_4$ alkyl substituent; wherein the film has an external field-induced net dipolar orientation of polymer molecules, and the film exhibits piezoelectric properties.

* * * * *